(12) United States Patent
Lv

(10) Patent No.: US 10,211,346 B2
(45) Date of Patent: Feb. 19, 2019

(54) LIQUID CRYSTAL DISPLAY PANEL HAVING AN ACTIVE LAYER COMPRISING MORE THAN TWO FILM LAYERS AND METHOD FOR MANUFACTURING THE SAME

(71) Applicant: Shenzhen China Star Optoelectronics Technology Co., Ltd., Shenzhen, Guangdong (CN)

(72) Inventor: Xiaowen Lv, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 59 days.

(21) Appl. No.: 15/329,323

(22) PCT Filed: Jan. 11, 2017

(86) PCT No.: PCT/CN2017/070896
§ 371 (c)(1),
(2) Date: Jan. 26, 2017

(87) PCT Pub. No.: WO2018/018855
PCT Pub. Date: Feb. 1, 2018

(65) Prior Publication Data
US 2018/0212064 A1   Jul. 26, 2018

(30) Foreign Application Priority Data
Jul. 29, 2016   (CN) .......................... 2016 1 0613722

(51) Int. Cl.
| | |
|---|---|
| H01L 29/786 | (2006.01) |
| G02F 1/1333 | (2006.01) |
| G02F 1/1368 | (2006.01) |
| H01L 29/34 | (2006.01) |
| H01L 29/66 | (2006.01) |
| H01L 21/02 | (2006.01) |
| H01L 21/306 | (2006.01) |

(52) U.S. Cl.
CPC ...... *H01L 29/78696* (2013.01); *G02F 1/1333* (2013.01); *G02F 1/1368* (2013.01); *H01L 29/34* (2013.01); *H01L 29/66742* (2013.01); *H01L 29/78609* (2013.01); *H01L 21/0262* (2013.01); *H01L 21/02587* (2013.01); *H01L 21/306* (2013.01)

(58) Field of Classification Search
CPC ........................ H01L 29/78696; H01L 29/786
See application file for complete search history.

(56) References Cited

U.S. PATENT DOCUMENTS 8,299,466 B2 * 10/2012 Furuta ............... H01L 29/78618
257/57

\* cited by examiner

*Primary Examiner* — Quoc Hoang

(57) ABSTRACT

Disclosed is a liquid crystal display panel and a method for manufacturing the same. The panel includes a thin-film transistor. An active layer in communication with a source and a drain of the thin-film transistor is formed by more than two film layers. The active layer contacts with a passivation layer of the panel on a non-high-speed deposited film layer of the active layer.

5 Claims, 2 Drawing Sheets

LIQUID CRYSTAL DISPLAY PANEL HAVING AN ACTIVE LAYER COMPRISING MORE THAN TWO FILM LAYERS AND METHOD FOR MANUFACTURING THE SAME

CROSS-REFERENCE TO RELATED APPLICATIONS

The present application claims the priority of Chinese patent application CN 201610613722.3, entitled "Liquid crystal display panel and method for manufacturing the same" and filed on Jul. 29, 2016, the entirety of which is incorporated herein by reference.

FIELD OF THE INVENTION

The present disclosure relates to the technical field of liquid crystal display, and in particular, to a liquid crystal display panel and a method for manufacturing the same.

BACKGROUND OF THE INVENTION

In recent years, large-sized and high-resolution televisions are becoming more and more popular among merchants and customers. As size of a display device becomes larger and larger, on the premise of ensuring a starting current (Ion) and a threshold voltage (Vth), electric-capacity-holding effects of a display device is becoming more and more important. Since a liquid crystal display device is in an off-state during most of the time, a leakage current exerts a great influence on display performance of the device.

Generally, for a BCE (B stands for base, C for collector and E for emitter) transistor structure, after a channel is formed, there are many follow-up procedures like depositing metal. The follow-up procedures will influence characteristics of a backchannel. An active layer usually adopts an AL/AH structure. AL is a main electrically-conductive channel, and is formed at a low speed, so as to ensure good thin-film quality and few interfacial defects. AH, formed at a high speed, has many interfacial defects, and many interfacial states in a backchannel. While a gate voltage Vg is a small negative voltage, in other words, while a transistor is in an electrically-conductive negative sub-threshold region, a small electrically-conductive channel will be formed in the backchannel, which will lead to a backchannel electric leakage. In the meanwhile, a turn-off voltage of a TFT-LCD device is generally provided around the negative sub-threshold region. Besides, due to poor homogeneity and many defects of the deposition, AH is easily affected by following procedures, resulting in a high and dispersed leakage current in the backchannel and leading to problems like uneven luminance display, reliability problems, etc.

Thus, to improve performance of a display device, it is of great significance to improve homogeneity of a backchannel and interfacial characteristics of the active layer in the backchannel. Performance of the sub-threshold region I-V of the device, as shown in FIG. 1, is mainly affected by the backchannel of a device and interfacial characteristics of the backchannel and a passivation layer PV.

SUMMARY OF THE INVENTION

In order to solve the above problem, the present disclosure provides a liquid crystal display panel and a method for manufacturing the same.

According to one aspect of the present disclosure, a liquid crystal display panel is provided. The liquid crystal display panel comprises a thin-film transistor. An active layer in communication with a source and a drain of the thin-film transistor is formed by more than two film layers. The active layer is in contact with a passivation layer of the panel on a non-high-speed deposited film layer of the active layer.

According to one embodiment of the present disclosure, the active layer comprises three film layers.

According to one embodiment of the present disclosure, a second film layer is formed between a first film layer and a third film layer. The first film layer is a low-speed deposited film layer, and the third film layer is a high-speed deposited film layer. A speed of forming the second film layer is between a speed of forming the first film layer and a speed of forming the third film layer.

According to one embodiment of the present disclosure, the active layer is in contact with the passivation layer on the second film layer of the active layer.

According to one embodiment of the present disclosure, a sum of thicknesses of the first film layer and the second film layer accounts for ⅓ of a thickness of the entire active layer.

According to another aspect of the present disclosure, a method for manufacturing a liquid crystal display panel is provided. The method comprises the following steps. A gate is formed on a substrate. A gate insulation layer is formed on the gate. An active layer is formed on the gate insulation layer. The active layer comprises more than two film layers. An ohmic contact layer is formed on the active layer. A source and a drain of a thin-film transistor are formed on the ohmic contact layer. A passivation layer is formed on the source and the drain of the thin-film transistor. The active layer is in contact with the passivation layer on a non-high-speed deposited film layer of the active layer.

According to one embodiment of the present disclosure, the active layer comprises three film layers.

According to one embodiment of the present disclosure, the step of forming the active layer comprises steps of: forming a first film layer on the gate insulation layer; forming a second film layer on the first film layer; and forming a third film layer on the second film layer. The first film layer is a low-speed deposited film layer, and the third film layer is a high-speed deposited film layer. A speed of forming the second film layer is between a speed of forming the first film layer and a speed of forming the third film layer.

According to one embodiment of the present disclosure, the active layer is in contact with the passivation layer on the second film layer of the active layer.

According to one embodiment of the present disclosure, a sum of thicknesses of the first film layer and the second film layer accounts for ⅓ of a thickness of the entire active layer.

The present disclosure achieves the following beneficial effects.

An active layer AS in the prior art comprises two layers, a high-speed deposited film layer AH and a low-speed deposited film layer AL. The present disclosure changes the existing two-layer structure into an AL1/AL2/AH (three-layer) structure and ensures that a sum of thicknesses of the layer AL1 and the layer AL2 is greater than a thickness of the electrically-conductive layer AS, so as to ensure that the active layer which connects a backchannel and a passivation layer PV is the layer AL2. The layer AL2 is formed at a speed higher than a speed of forming the layer AL1 but lower than a speed of forming the layer AH, and therefore has a better film quality and interface-state density than the layer AH. In this way, a liquid crystal display panel in the present disclosure has better backchannel characteristics and a low electric leakage.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Figure 1:
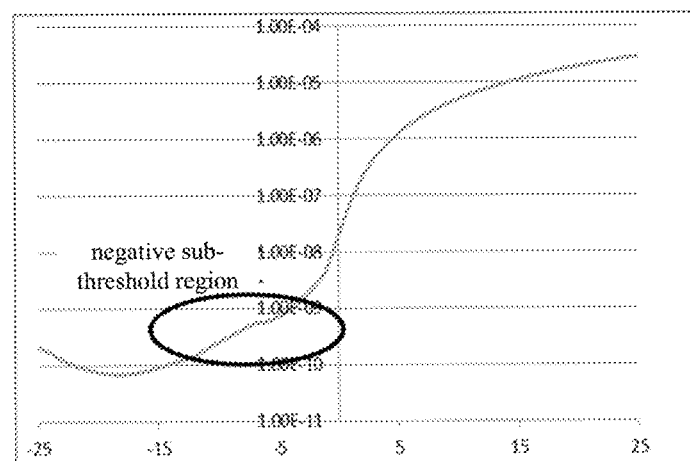
FIG. 1 schematically shows display of a sub-threshold region I-V in a liquid crystal display device in the prior art.
Figure 2:
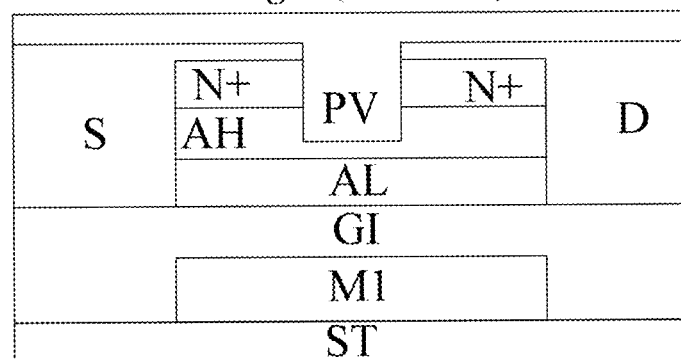
FIG. 2 schematically shows a section of a backchannel in a liquid crystal display panel in the prior art.

In an existing liquid crystal display panel, an active layer AS in communication with a source and a drain of a thin-film transistor is a two-layer structure comprising a high-speed deposited film layer AH and a low-speed deposited film layer AL. As illustrated in FIG. 2, a gate M1 is formed on a substrate ST. A gate insulation layer GI is formed on the gate M1. An active layer AS is formed on the gate insulation layer GI. The active layer AS comprises a low-speed deposited film layer AL formed on the gate insulation layer GI and a high-speed deposited film layer AH formed on the low-speed deposited film layer AL. An ohmic contact layer N+ is formed on the high-speed deposited film layer AH. A source S and a drain D of a thin-film transistor are formed on the ohmic contact layer N+. A passivation layer PV is formed on the source S and the drain D of the thin-film transistor.

As shown in FIG. 2, the passivation layer PV is in contact with the high-speed deposited film layer AH of the active layer AS. Due to its high film-forming speed, the layer AH has a worse film quality and interface-state density than the layer AL, resulting in poor homogeneity and many defects of the layer AH and high leakage currents in a backchannel. Speeds of forming the high-speed deposited film layer AH and the low-speed deposited film layer AL are relative to each other. In other words, the speed of forming the high-speed deposited film layer AH is faster than the speed of forming the low-speed deposited film layer AL. In the present disclosure, the high-speed deposited film layer AH is formed at the commonly-used high film-forming speed in the prior art and the low-speed deposited film layer AL is formed at the commonly-used low film-forming speed in the prior art.

To solve the above problems, the present disclosure provides a liquid crystal display panel which comprises a thin-film transistor. An active layer in communication with a source and a drain of the thin-film transistor is formed by more than two film layers. The active layer is in contact with a passivation layer of the panel on a non-high-speed deposited film layer of the active layer. By way of this, the layer that connects the passivation layer and the active layer has a better film quality and interface-state density than the layer AH. The backchannel can therefore have better characteristics and a low leakage current.

Figure 3:
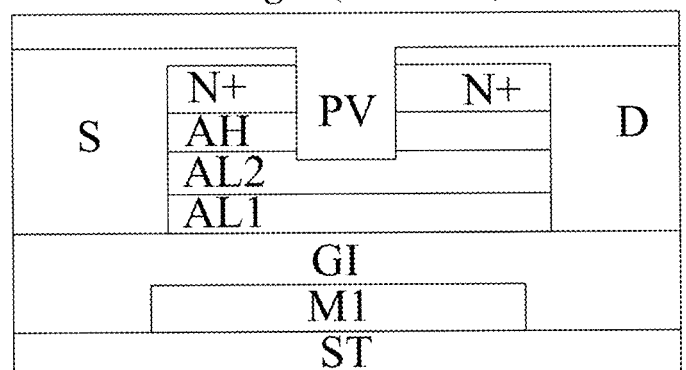
FIG. 3 schematically shows a section of a backchannel in a liquid crystal display panel in one embodiment of the present disclosure.

FIG. 3 schematically shows a section of a backchannel in a liquid crystal display panel in one embodiment of the present disclosure. An active layer in FIG. 3 comprises three film layers. The present disclosure will be explained below in detail with reference to FIG. 3. As shown in FIG. 3, in a liquid crystal display panel, a gate M1 is formed on a substrate ST. A gate insulation layer GI is formed on the gate M1. An active layer AS is formed on the gate insulation layer GI. The active layer AS comprises a first low-speed deposited film layer AL1 formed on the gate insulation layer GI, a second film layer AL2 formed on the first low-speed deposited film layer AL1 (i.e. a first film layer), and a high-speed deposited film layer AH (i.e. a third film layer) formed on the second film layer AL2 (i.e. a second film layer). An ohmic contact layer N+ is formed on the high-speed deposited film layer AH. A source S and a drain D of a thin-film transistor are formed on the ohmic contact layer N+. A passivation layer PV is formed on the source S and the drain D of the thin-film transistor.

It can be seen from a comparison between FIG. 2 and FIG. 3 that the active layers in the two structures have different structures. The prior art in FIG. 2 adopts a two-layer structure comprising a high-speed deposited film layer AH and a low-speed deposited film layer AL. The present disclosure in FIG. 3 adopts a structure of three film layers. The three film layers, in addition to a high-speed deposited film layer AH and a low-speed deposited film layer AL (i.e. the first low-speed deposited film layer AL1), further comprises a second film layer AL2 formed between the high-speed deposited film layer AH and the first low-speed deposited film layer AL1.

The second film layer AL2 is formed at a speed higher than a speed of forming the layer AL1 but lower than a speed of forming the layer AH and a better film quality and interface-state density than the AH layer. The backchannel can therefore have better characteristics and a low leakage current. Films formed by CVD (chemical vapor deposition) can be homogenous.

In one embodiment of the present disclosure, the active layer is in contact with the passivation layer on the second film layer of the active layer. As shown in FIG. 3, the backchannel is arranged to contact with the passivation layer PV on the second film layer AL2. The second film layer AL2 has a better film quality and interface state density than the layer AH, and therefore has better backchannel characteristics. A leakage current in the backchannel can be reduced.

To ensure thickness of an electrically-conductive layer of the backchannel and control time of this manufacturing procedure, in one embodiment of the present disclosure, a sum of thicknesses of the first low-speed deposited film layer AL1 (the first film layer) and the second film layer AL2 accounts for ⅓ of a thickness of the entire active layer.

The active layer AS in the prior art comprises two layers, a high-speed deposited film layer AH and a low-speed deposited film layer AL. The present disclosure changes the existing two-layer structure into an AL1/AL2/AH (three-layer) structure and ensures that the sum of the thicknesses of the layer AL1 and the layer AL2 is greater than the thickness of the electrically-conductive layer in the active layer AS, so as to ensure that the active layer that connects the backchannel and the passivation layer PV is the layer AL2. This is because the layer AL2 is formed at a speed higher than a speed of forming the layer AL1 and lower than a speed of forming the layer AH and therefore has a better film quality and interface-state density than the layer AH. The present disclosure thus has better backchannel characteristics and a low leakage current.

Figure 4:
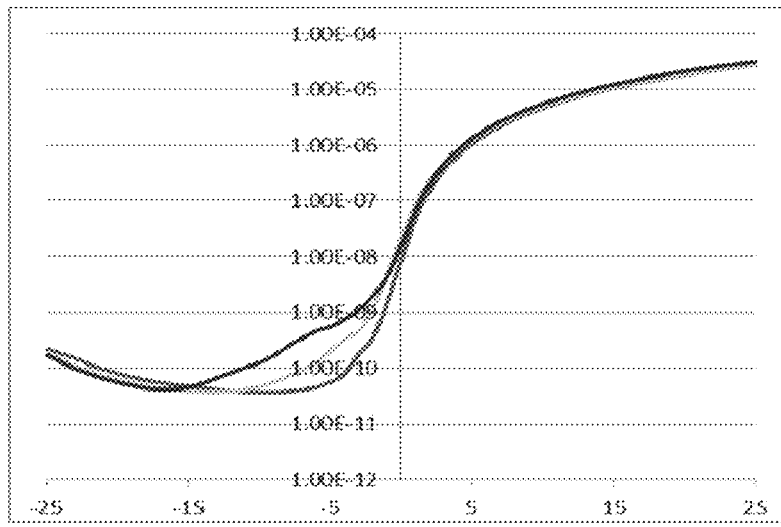
FIG. 4 schematically shows display of leakage currents at different locations in a backchannel of a liquid crystal display panel in the prior art.

FIG. 4 schematically shows leakage currents at three different positions on the active layer in the two-layer structure of the prior art. As shown in this figure, leakage currents Ioff at certain positions in the backchannel are high, dispersed and not uniform.

Figure 5:
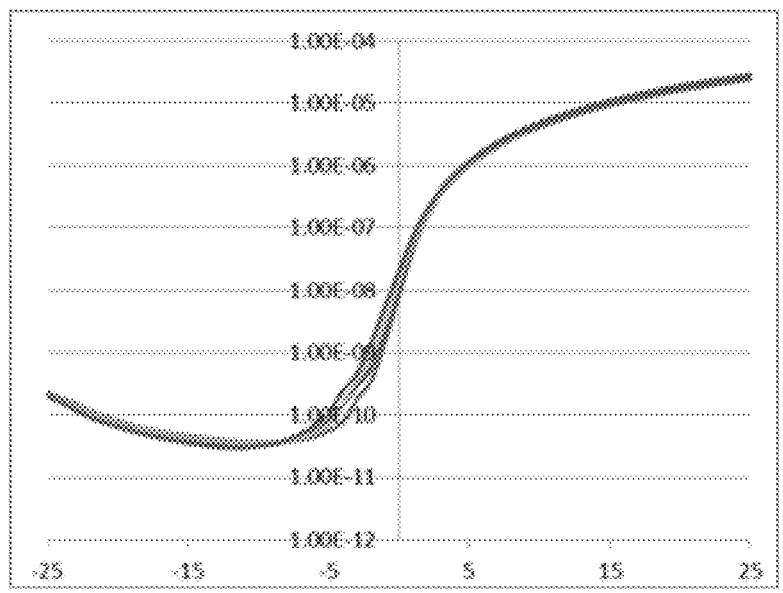
FIG. 5 schematically shows display of leakage currents at different locations in a backchannel of a liquid crystal display panel in the present disclosure.

FIG. 5 schematically shows leakage currents at three different positions on the active layer in the present disclosure. As shown in this figure, electric uniformity of the backchannel is good and there are no positions with obviously high leakage currents Ioff. As seen from FIG. 5, the present disclosure reduces leakage currents Ioff in the backchannel and improves uniformity of a device.

According to another aspect of the present disclosure, a method for manufacturing a liquid crystal display panel is provided. The method comprises the following steps. A gate M1 is formed on a substrate ST. A gate insulation layer GI is formed on the gate M1. An active layer AS is formed on the gate insulation layer GI. The active layer AS comprises a first low-speed deposited film layer AL1 formed on the gate insulation layer GI, a second film layer formed on the first low-speed deposited film layer AL1 (i.e. a first film layer), and a high-speed deposited film layer AH (i.e. a third film layer) formed on the second film layer AL2 (i.e. a second film layer). An ohmic contact layer N+ is formed on the high-speed deposited film layer AH. A source S and a drain D of a thin-film transistor are formed on the ohmic contact layer N+. A passivation layer PV is formed on the source S and the drain D of the thin-film transistor. The active layer is in contact with the passivation layer on a non-high-speed deposited film layer of the active layer. FIG. 3 shows a section of a backchannel formed in this liquid crystal display panel.

In one embodiment of the present disclosure, the active layer comprises three film layers. The step of forming the active layer specifically comprises steps of: forming a first film layer on the gate insulation layer; forming a second film layer on the first film layer; and forming a third film layer on the second film layer. The first film layer is a low-speed deposited film layer, and the third film layer is a high-speed deposited film layer. A speed of forming the second film layer is between a speed of forming the first film layer and a speed of forming the third film layer. This is realized in practice by changing a two-step deposition process into a three-step deposition process during depositing of the active layer AS by CVD and resetting etching conditions and time during etching. The manufacturing process is easy to realize.

In one embodiment of the present disclosure, the active layer is in contact with the passivation layer on the second film layer of the active layer.

In one embodiment of the present disclosure, a sum of thicknesses of the first film layer and the second film layer accounts for ⅓ of a thickness of the entire active layer.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing a liquid crystal display panel, comprising steps of:
   forming a gate on a substrate;
   forming a gate insulation layer on the gate;
   forming an active layer on the gate insulation layer, wherein the active layer comprises more than two film layers;
   forming an ohmic contact layer on the active layer;
   forming a source and a drain of a thin-film transistor on the ohmic contact layer; and
   forming a passivation layer on the source and the drain of the thin-film transistor, wherein the active layer is in contact with the passivation layer on a non-high-speed deposited film layer of the active layer,
   wherein the step of forming the active layer comprises steps of:
   forming a first film layer on the gate insulation layer;
   forming a second film layer on the first film layer; and
   forming a third film layer on the second film layer,
   wherein the first film layer is a low-speed deposited film layer, and the third film layer is a high-speed deposited film layer, and
   wherein a speed of forming the second film layer is between a speed of forming the first film layer and a speed of forming the third film layer.

2. The method according to claim 1, wherein the active layer comprises three film layers.

3. The method according to claim 1, wherein the active layer is in contact with the passivation layer on the second film layer of the active layer.

4. The method according to claim 3, wherein a sum of thicknesses of the first film layer and the second film layer accounts for ⅓ of a thickness of the entire active layer.

5. The method according to claim 1, wherein a sum of thicknesses of the first film layer and the second film layer accounts for ⅓ of a thickness of the entire active layer.

* * * * *